United States Patent
Park et al.

(10) Patent No.: US 7,361,554 B2
(45) Date of Patent: Apr. 22, 2008

(54) MULTI-BIT NON-VOLATILE MEMORY DEVICE, METHOD OF OPERATING THE SAME, AND METHOD OF MANUFACTURING THE MULTI-BIT NON-VOLATILE MEMORY DEVICE

(75) Inventors: Yoon-dong Park, Yongin-si (KR);
Sun-ae Seo, Hwaseong-si (KR);
Choong-rae Cho, Gimhae-si (KR);
Won-joo Kim, Suwon-si (KR);
Sang-min Shin, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/812,574

(22) Filed: Jun. 20, 2007

(65) Prior Publication Data
US 2007/0247913 A1 Oct. 25, 2007

Related U.S. Application Data

(62) Division of application No. 11/181,724, filed on Jul. 15, 2005, now Pat. No. 7,256,447.

(30) Foreign Application Priority Data
Nov. 10, 2004 (KR) ........................ 10-2004-0091491

(51) Int. Cl.
*H01L 21/336* (2006.01)
(52) U.S. Cl. .................. 438/266; 438/267; 438/149; 438/479; 257/316; 257/324; 257/347; 257/E29.129; 257/E29.3

(58) Field of Classification Search ................ 438/266; 257/E29.129
See application file for complete search history.

(56) References Cited

U.S. PATENT DOCUMENTS 6,157,061 A * 12/2000 Kawata ....................... 257/316
6,667,201 B2 12/2003 Jang

FOREIGN PATENT DOCUMENTS

KR 1999-023985 3/1999

OTHER PUBLICATIONS

Korean Office Action dated May 4, 2006.

* cited by examiner

*Primary Examiner*—Tu-Tu Ho
(74) *Attorney, Agent, or Firm*—Buchanan Ingersoll & Rooney PC

(57) ABSTRACT

Disclosed are a multi-bit non-volatile memory device, a method of operating the same, and a method of manufacturing the multi-bit non-volatile memory device. A unit cell of the multi-bit non-volatile memory device may be formed on a semiconductor substrate may include: a plurality of channels disposed perpendicularly to the upper surface of the semiconductor substrate; a plurality of storage nodes disposed on opposite sides of the channels perpendicularly the upper surface of the semiconductor substrate; a control gate surrounding upper portions of the channels and the storage nodes, and side surfaces of the storage nodes; and an insulating film formed between the channels and the storage nodes, between the channels and the control gate, and between the storage nodes and the control gate.

6 Claims, 12 Drawing Sheets

MULTI-BIT NON-VOLATILE MEMORY DEVICE, METHOD OF OPERATING THE SAME, AND METHOD OF MANUFACTURING THE MULTI-BIT NON-VOLATILE MEMORY DEVICE

BACKGROUND OF THE DISCLOSURE

This application is a division of application Ser. No. 11/181,724, filed Jul. 15, 2005, now U.S. Pat. No. 7,256,447, which claims the benefit of Korean Patent Application No. 10-2004-0091491, filed on Nov. 10, 2004, in the Korean Intellectual Property Office, the disclosure of which is incorporated herein in its entirety by reference.

1. Field of the Disclosure

Embodiments of the present disclosure include a semiconductor memory device, and more particularly, to a multi-bit non-volatile memory (NVM) device, a method of operating the same, and a method of manufacturing the multi-bit NVM device.

2. Description of the Related Art

Semiconductor memory devices are categorized into volatile memory devices and non-volatile memory (NVM) devices. Volatile memory devices, such as DRAMs, have been used in, for example, computers in order to store data in a hard disk and to process data in a short time when power is supplied.

However, as demand for mobile phones and digital cameras increases, demand for NVM devices also increases due to their advantages over DRAMs, which are used in computers. For example, NVM devices can process data in a short time, and store data even when power is no longer supplied.

An example of NVM devices is a flash memory device with a storage node. Depending on the type of the storage node, flash memory devices are classified into floating gate devices, and SONOS devices with oxide/nitride/oxide (ONO) structures. A conventional flash memory device will now be described.

FIG. 1 is a sectional view of a conventional floating gate flash memory device 100.

Referring to FIG. 1, the conventional flash memory device 100 includes a floating gate 120 which is used as a storage node, and is insulated from a control gate 130 by an inter-gate insulating film 125. In addition, the floating gate 120 is insulated from a semiconductor substrate 105 by a gate insulating film 115.

In the conventional flash memory device 100 shown in FIG. 1, when a voltage is applied to the control gate 130, charge tunneling occurs through the gate insulating film 115 and charges are stored in the floating gate 120. Alternatively, a voltage can be applied to a source/drain region 110 of the semiconductor substrate 105 to generate hot carriers that are injected into the floating gate 120.

In this case, cells are arranged in an array on the entire surface of the semiconductor substrate 105, thus increasing the integrity of the flash memory device. Recently, NAND array flash memory devices have been used in high-capacity devices due to their high integrity.

FIG. 2 is a sectional view of a conventional SONOS flash memory device 150.

Referring to FIG. 2, the conventional SONOS-type flash memory device 150 includes a nitride layer 170 that is used as a storage node. The nitride layer 170 is insulated from a semiconductor substrate 155 and a control gate 180 by oxide layers 165 and 175, respectively.

In this structure, when a voltage is applied to the control gate 180 and a source/drain region 160 of the semiconductor substrate 155, hot carriers are injected into the nitride layer 170. On the other hand, when a high-voltage is applied to the semiconductor substrate 155, charges existing in the nitride layer 170 are removed.

The conventional memory devices 100 and 150 shown in FIGS. 1 and 2 have a planar array structure. However, to increase integrity and capacity, many efforts have been made to develop a memory device with a three-dimensional array structure. In addition, methods of operating a unit cell in multi bits in order to increase a memory capacity have been developed.

SUMMARY OF THE DISCLOSURE

Embodiments of the present disclosure may provide a multi-bit non-volatile memory device.

Embodiments of the present disclosure may also provide a method of operating the multi-bit non-volatile memory device.

Embodiments of the present disclosure may also provide a method of manufacturing the multi-bit non-volatile memory device.

According to an aspect of the present disclosure, there may be provided a unit cell of a multi-bit nonvolatile memory device formed on a semiconductor substrate, the unit cell may include: a first insulating film; first and second channels disposed on the first insulating film perpendicularly to an upper surface of the semiconductor substrate; first and second storage nodes disposed on the first insulating film on opposite sides of the channels perpendicularly to the upper surface of the semiconductor substrate; a control gate surrounding upper portions of the storage nodes and the channels, and side surfaces of the storage nodes; and a second insulating film formed between the channels and the storage nodes, between the channels and the control gate, and between the storage nodes and the control gate.

In this case, the channels may be composed of transition metal oxide, being able to be transformed into an insulating material or a conducting material according to application or removal of a voltage, respectively.

According to another aspect of the present disclosure, there may be provided a unit cell of a multi-bit nonvolatile memory device, the unit cell may include: a semiconductor substrate; first and second storage nodes disposed on the semiconductor substrate parallel to an upper surface of the semiconductor substrate; first and second channels disposed between the storage nodes parallel to the upper surface of the semiconductor substrate; third and fourth channels disposed between the first and second channels perpendicularly to the upper surface of the semiconductor substrate; third and fourth storage nodes disposed on opposite sides of the third and fourth channels perpendicularly to the upper surface of the semiconductor substrate; a control gate, having a box form and surrounding the storage nodes, formed on the semiconductor substrate; and an insulator formed between the channels and the storage nodes, between the channels and the control gate, and between the storage nodes and the control gate.

The channels may be composed of transition metal oxide, being able to be transformed into an insulating material or a conducting material according to application or removal of a voltage, respectively.

According to yet another aspect of the present disclosure, there may be provided a nand cell array of a multi-bit non-volatile memory device, wherein a plurality of the unit cells according to the aspect of the present disclosure, arranged along an axis, may be formed on a semiconductor substrate, and the first channels of the unit cells are connected and the second channels of the unit cells are connected. In addition, the storage nodes of the unit cells may be connected along the axis.

According to still another aspect of the present disclosure, there may be provided a nand cell array of a multi-bit non-volatile memory device, wherein a plurality of the unit cell according to another aspect of the present disclosure, arranged along an axis, may be formed on a semiconductor substrate, and the first channels of the unit cells may be connected and the second channels of the unit cells are connected. In addition, each storage node of the unit cells may be connected along the axis.

According to further aspect of the present disclosure, there may be provided a nand cell array of a multi-bit non-volatile memory device, wherein a plurality of the unit cells according to the aspect of the present disclosure may be arranged along x-axis, y-axis, and z-axis, and each channel of the unit cells arranged in a line with same x and z values may be connected to one another.

In addition, each storage node of the unit cells arranged in the line with same x and z values may be connected to one another. Further, each channel of the unit cells formed on a plane with a same x value may be connected to one another by a metal line, thus being a common bit line.

According to an aspect of the present disclosure, there may be provided a nand cell array of a multi-bit non-volatile memory device, wherein a plurality of the unit cells according to another aspect of the present disclosure may be arranged along x-axis, y-axis, and z-axis, and channels of the unit cells arranged in a line with same x and z values may be connected to one another.

In addition, the storage nodes of the unit cells arranged in the line with same x and z values may be connected to one another. Further, channels of the unit cells formed on a plane with a same x value may be connected to one another by a metal line, thus being a common bit line.

According to another aspect of the present disclosure, there may be provided a method of operating a non-volatile memory device using the unit cell according to the aspect of the present disclosure, wherein the control gate may be used as a common word line, the first channel may be used as a first bit line, the second channel may be used as a second bit line, and the unit cell may have a plurality of bits that can be operated by selecting the word line and respective bit lines.

According to yet another aspect of the present disclosure, there may be provided a method of operating a non-volatile memory device using the unit cell according to another aspect of the present disclosure, wherein the control gate may be used as a common word line, each of the channels may be used as a bit line, and the unit cell may have a plurality of bits that can be operated by selecting the word line and the bit lines.

According to still another aspect of the present disclosure, there may be provided a method of manufacturing a multi-bit non-volatile memory device, the method including: forming a first insulating film or insulating layer on a semiconductor substrate; forming a second insulating film on the first insulating film; forming a trench by etching a portion of the second insulating film; forming a pair of storage nodes on a side wall of the trench; forming a pair of tunneling oxide layers on a side wall of the storage nodes; forming a pair of channels on a side wall of the tunneling oxide layers; forming a third insulating film, filling between the channels, being planarized; forming patterns of the second and third insulating films outside the storage nodes by etching the second and third insulating films; and forming a control gate on the entire surface of the resultant structure.

BRIEF DESCRIPTION OF THE DRAWINGS

The above and other features and advantages of embodiments of the present invention will become more apparent by describing in detail exemplary embodiments thereof with reference to the attached drawings in which.

DETAILED DESCRIPTION OF EXEMPLARY EMBODIMENTS OF THE DISCLOSURE

Figure 1:
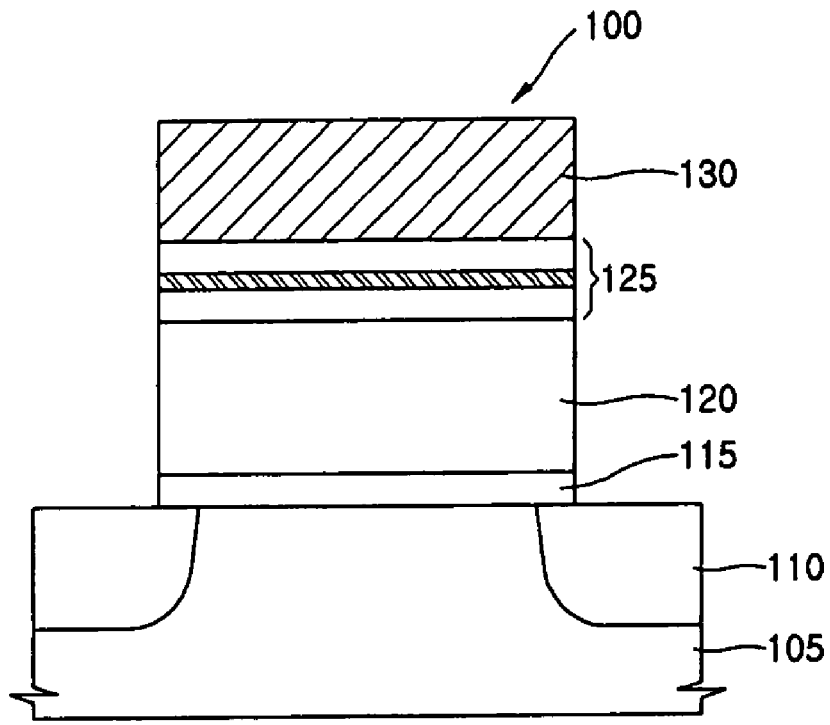
FIG. 1 is a sectional view of a conventional floating gate-type flash memory device.
Figure 2:
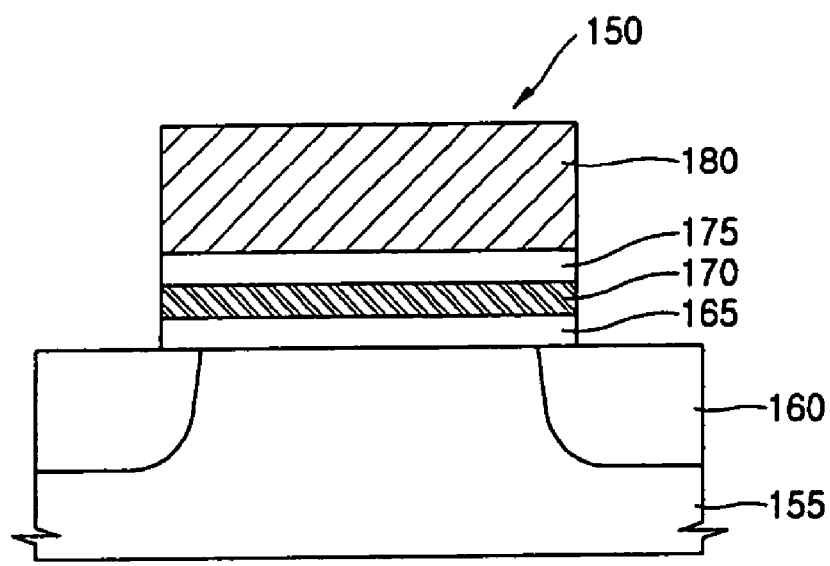
FIG. 2 is a sectional view of a conventional SONOS-type flash memory device.

The present invention will now be described more fully with reference to the accompanying drawings, in which exemplary embodiments of the disclosure are shown. The invention may, however, be embodied in many different forms and should not be construed as being limited to the embodiments set forth herein. In the drawings, the thicknesses of layers and regions are exaggerated for clarity.

Figure 3:
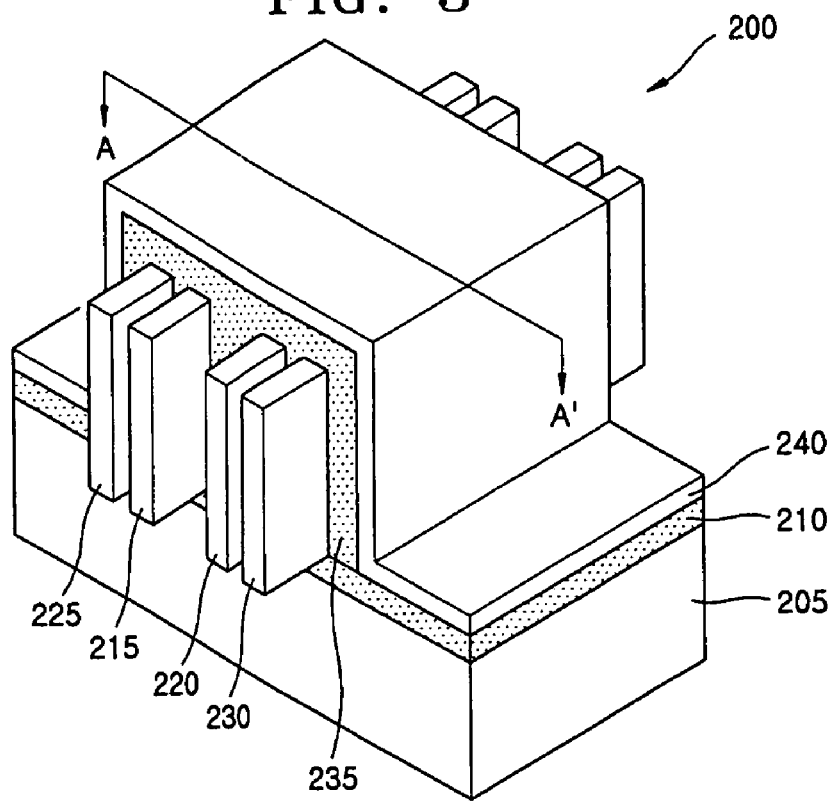
FIG. 3 is a perspective view of a unit cell of a multi-bit flash memory device according to a first embodiment of the present disclosure.
Figure 4:
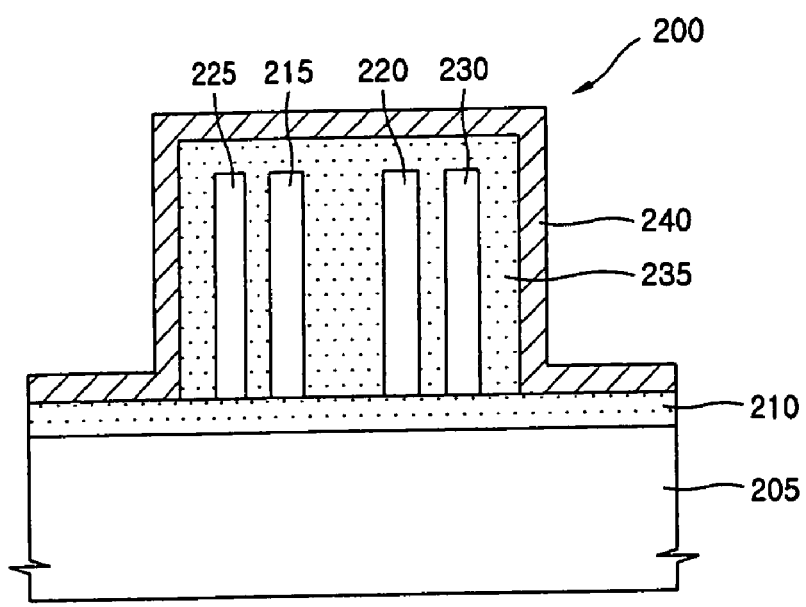
FIG. 4 is a sectional view taken along a line A-A' in FIG. 3.

FIG. 3 is a perspective view of a unit cell 200 of a multi-bit flash memory device according to a first embodiment of the present disclosure, and FIG. 4 is a sectional view taken along a line A-A' in FIG. 3.

Referring to FIG. 3, the unit cell 200 may include a pair of channels 215 and 220 and a pair of storage nodes 225 and 230, all of which extend perpendicularly to an upper surface of a semiconductor substrate 205. In addition, a control gate 240 may surround side surfaces of the storage nodes 225 and 230 and upper surfaces of the channels 215 and 220 and the storage nodes 225 and 230.

The unit cell 200 may be insulated from the semiconductor substrate 205 by an insulating film 210. In addition, an insulating film 235 may insulate the channels 215 and 220 from the storage nodes 225 and 230, the channels 215 and 220 from the control gate 240, and the storage nodes 225 and 230 from the control gate 240.

Referring to FIG. 4, the channels 215 and 220, which may be in the form of plates, are perpendicular to the upper surface of the semiconductor substrate 205. The channels 215 and 220 may be composed of a transition metal oxide (TMO) that acts as an insulating material or a conducting material according to the application or removal of a voltage. The channels 215 and 220 may be composed of vanadium oxide (VOx).

When an electric field is applied to TMO, TMO may act as a conducting material. On the other hand, when the electric field is removed from TMO, TMO may act as an insulating material. Such characteristics of TMO are similar to those of silicon. In addition, according to pattern of the electric field, the entire TMO or a portion of TMO may be conductive. Therefore, the TMO extending vertical may replace bulk silicon, which is conventionally used to form horizontal channels.

Referring to FIG. 3, the storage nodes 225 and 230, which extend perpendicularly to the upper surface of the semiconductor substrate 205, may be formed outside the channels 215 and 220. The storage nodes 225 and 230 may be parallel to the channels 215 and 220. The storage nodes 225 and 230 may be formed in the form of plates.

When the storage nodes 225 and 230 are composed of poly silicon or nano-crystal silicon, the storage nodes 225 and 230 may become a floating gate. When the storage nodes 225 and 230 are composed of nitride, the storage nodes 225 and 230 may act as a SONOS storage unit.

The insulating films 210 and 235 may be composed of silicon oxide. Further, a portion of the insulating film 235 formed between the channel 215 and the storage node 225 and the channel 220 and the storage node 230 may be thin, which enables tunnelling of charges and allows hot carriers to be injected. In addition, the thickness of a portion of the insulating film 235 formed between the storage nodes 225 and 230 and the control gate 240 may be set according to a coupling rate between a voltage applied to the control gate 240 and the storage nodes 225 and 230.

In this case, the control gate 240 of the unit cell 200 may be used as a common word line. Each of the channels 215 and 220 is used as a bit line. Accordingly, a two-bit operation may be performed by selecting the bit lines 215 and 220.

In detail, the storage node 225 may be programmed by selecting the channel 215 and applying a program voltage to the control gate 240. Likewise, the storage node 230 may be programmed by selecting the channel 220 and applying a program voltage to the control gate 240. Accordingly, a two-bit operation may be realized in the unit cell 200 by selecting respective channels 215 and 220.

In addition, the storage nodes 225 and 230 may be erased by applying an erase voltage between the channel 215 and the control gate 240, and between the channel 220 and the control gate 240. Again, in this case, a two-bit operation, may be realized by selecting both the channels 215 and 220.

The two-bit information stored in the unit cell 210 may be identified by detecting threshold voltage of the channels 215 and 220, which depend on whether charges are stored in the storage nodes 225 and 230.

Therefore, as mentioned above, a multi-bit operation can be performed by using the unit cell 200, which includes the control gate 240 used as a common word line, and the channels 215 and 220 used as bit lines.

Figure 5:
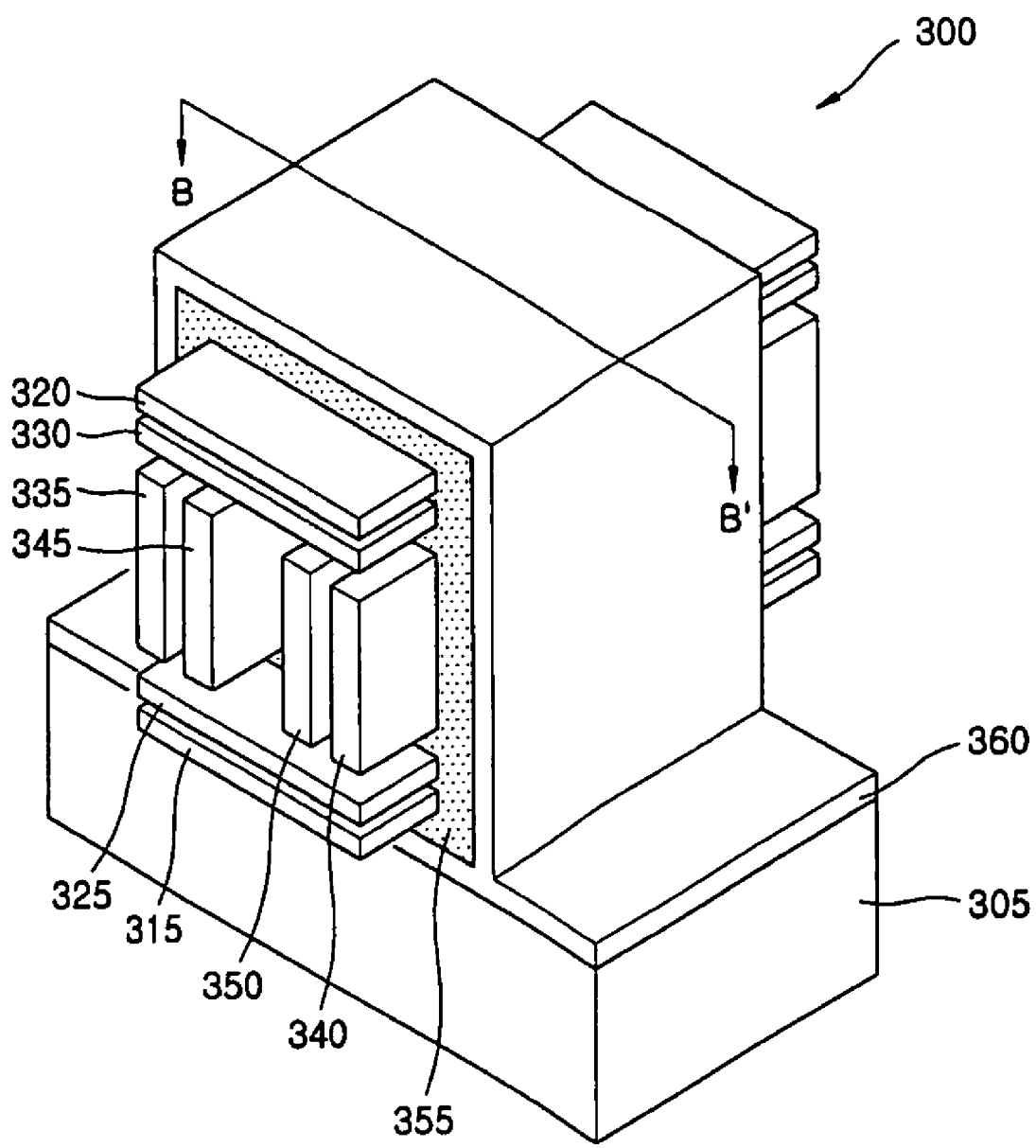
FIG. 5 is a perspective view of a unit cell of a multi-bit flash memory device according to a second embodiment of the present disclosure.
Figure 6:
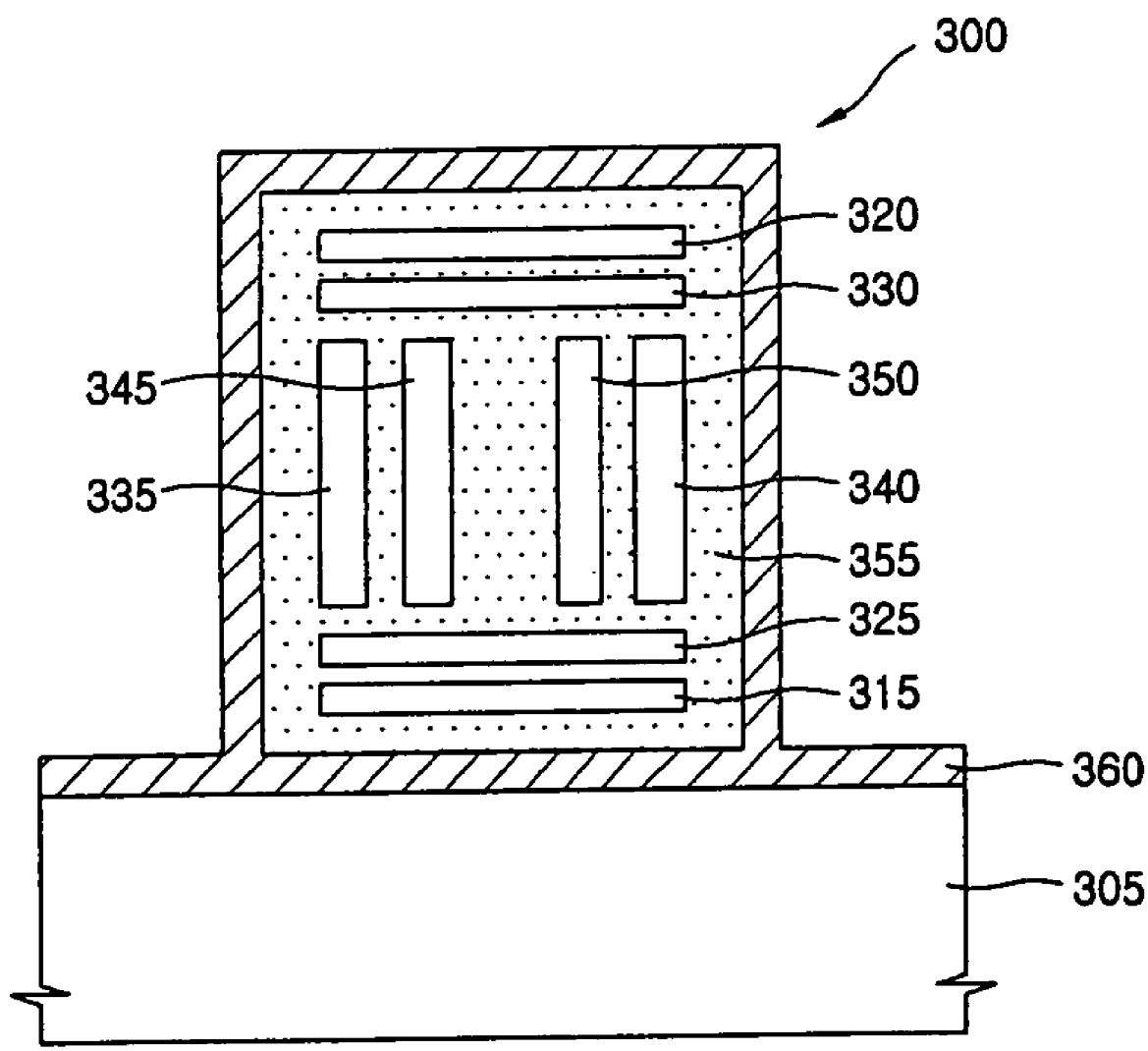
FIG. 6 is a sectional view taken along a line A-A' in FIG. 5.

FIG. 5 is a perspective view of a unit cell 300 of a multi-bit flash memory device according to a second embodiment of the present invention, and FIG. 6 is a sectional view taken along a line A-A' in FIG. 5. The multi-bit flash memory device according to the second embodiment of the present disclosure may be different from the multi-bit flash memory device according to the first embodiment of the present disclosure in that a device according to the second embodiment may include additional channels and storage nodes and a control gate that extends below the channels and storages nodes. Therefore, elements in the present embodiment and the first embodiment with the same structure may be understood with reference to the description of the first embodiment.

Referring to FIGS. 5 and 6, the unit cell 300 may include four channels 325, 330, 345 and 350 and four storage nodes 315, 320, 335 and 340. In addition, a control gate 360, being a box-shape and surrounding the storage nodes 315, 320, 335, and 340 may be formed on a semiconductor substrate 305.

The storage nodes 315 and 320 and the channels 325 and 330 may be parallel to an upper surface of the semiconductor substrate 305, and the storage nodes 335 and 340 and the channels 345 and 350 may be perpendicular to the upper surface of the semiconductor substrate 305. The channels 325, 330, 345 and 350 and the storage nodes 315, 320, 335 and 340 may be the form of plates.

An insulating film 355 insulates the channels 325, 330, 345 and 350 from the storage nodes 315, 320, 335, and 340; the channels 325, 330, 345 and 350 and the storage nodes 315, 320, 335 and 340 from the control gate 360.

The channels 325, 330, 345 and 350 may be composed of TMO that act as an insulating material and a conducting material according to the application and removal of a voltage, respectively. The channels 325, 330, 345 and 350 may be composed of VOx.

The storage nodes 315, 320, 335 and 340 may be composed of poly silicon, nano-crystal silicon or nitride. The insulating film 355 may be composed of silicon oxide. Further, portions of the insulating film 355 formed between the channel 325 and the storage node 315, between the channel 330 and the storage node 320, between the channel 345 and the storage node 335, and the channel 350 and the storage node 340 may be thin, which enables tunnelling of charges and allows hot carriers to be injected.

In the unit cell 300, the control gate 360 may be used as a common word line, and each of the channels 325, 330, 345 and 350 may be used as a bit line. Accordingly, four-bit operation may be realized by selecting the bit lines 325, 330, 345 and 350.

The storage nodes 315, 320, 335 and 340 can be programmed by selecting one of the channels 325, 330, 345 and 350 and applying a program voltage to the control gate 360. Therefore, a four-bit operation may be performed.

In addition, the storage nodes 315, 320, 335 and 340 may be erased by applying an erase voltage between the channel 325 and the control gate 360, between the channel 330 and the control gate 360, between the channel 345 and the control gate 360, and between the channel 350 and the control gate 360, respectively. In this case, all four bits can be erased by selecting all of the channels 325, 330, 345 and 350 at the same time.

The 4-bit information stored in the unit cell 300 can be identified by detecting the threshold voltages of the channels 325, 330, 345 and 350, which depend on whether charges are stored in the stored in the storage nodes 315, 320, 335 and 340.

Therefore, as mentioned above, a multi-bit operation may be performed by using the unit cell 300 which includes the control gate 360 used as a common word line and the channels 325, 330, 345 and 350 used as bit lines.

Figure 7:
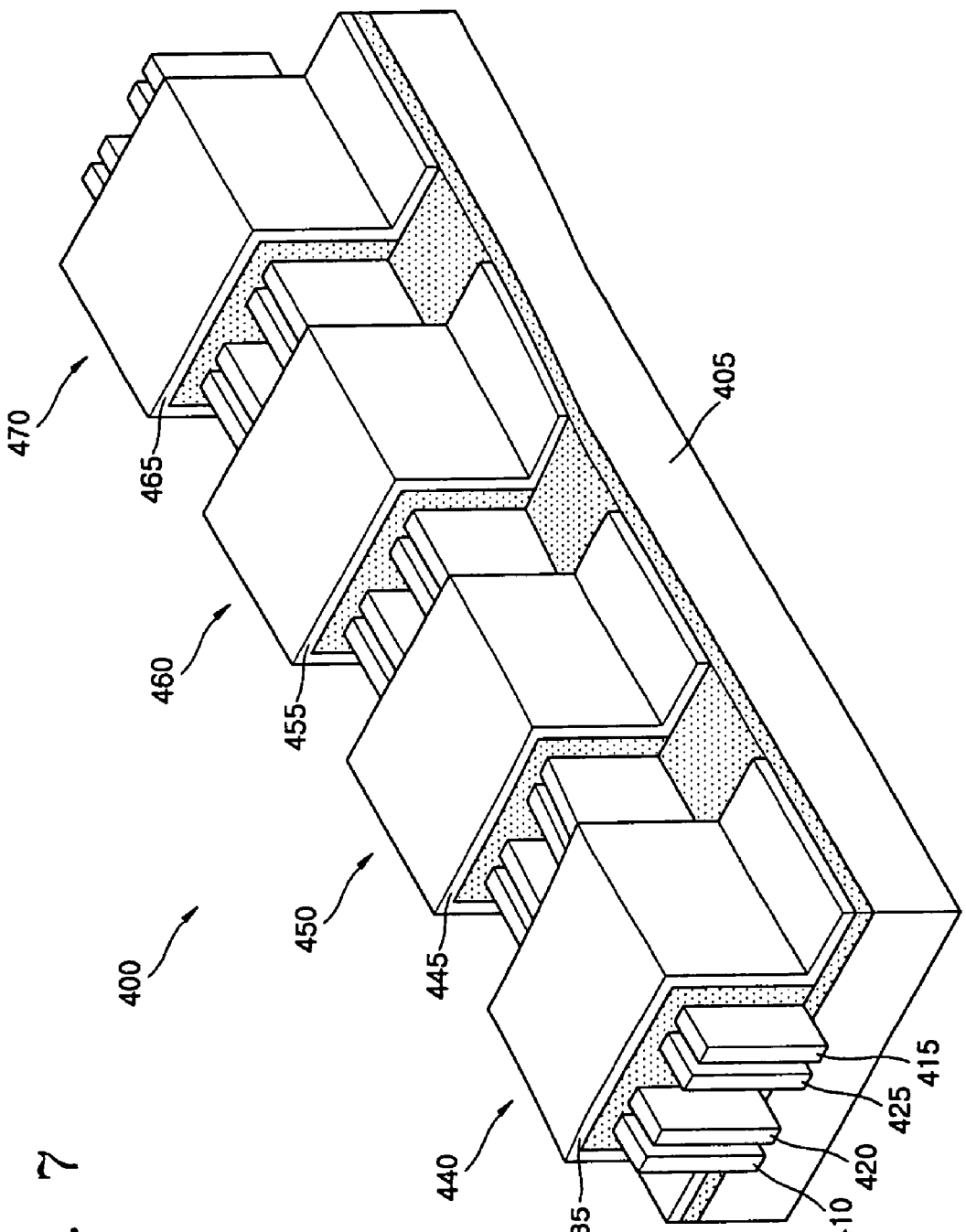
FIG. 7 is a perspective view of a nand cell array of a multi-bit flash memory device according to a third embodiment of the present disclosure.

FIG. 7 is a perspective view of a nand cell array 400 of a multi-bit flash memory device according to a third embodiment of the present invention.

Referring to FIG. 7, the nand cell array 400 may include unit cells 440, 450, 460 and 470 disposed along an axis. In this case, each of the unit cells 440, 450, 460 and 470 may include a channel 420, and the channels 410 may be connected to one another. Each of the unit cells 440, 450, 460 and 470 may include a channel 425, and the channels 425 may be connected to one another.

Each of the unit cells 440, 450, 460 and 470 may have the same structure as the unit cell (200 shown in FIG. 3) according to the first embodiment. Therefore, the structures of unit cells 440, 450, 460 and 470 may be understood from the description made with reference to FIGS. 3 and 4 and description thereof.

Referring to FIG. 7, storage nodes 410 and 415 may be common nodes of the unit cells 440, 450, 460 and 470. The storage nodes 410 and 415 may be composed of nitride or nano crystal silicon. Although the storage nodes 410 and 415 extend through the unit cells 440, 450, 460 and 470, charges stored in the storage nodes 410 and 415 are confined to the respective unit cells 440, 450, 460 and 470.

In the nand cell array 400, control gates 435, 445, 455 and 465 may be used as word lines of the unit cells 440, 450, 460 and 470, respectively. In addition, each of the channels 420 and 425 may be used as a common bit line.

Accordingly, eight-bit operation can be realized by selecting a word line and a bit line. In the present embodiment, the number of the unit cells may be set for exemplary purposes. The number of bits can be changed by changing the number of the unit cells.

The method of operating the unit cell may be identical to the method described in the first embodiment except that the method of the present embodiment may include selecting one of the control gates 435, 445, 455 and 465 of the nand cell array 400. Therefore, those skilled in the art may easily understand a method of operating the nand cell array 400.

Figure 8:
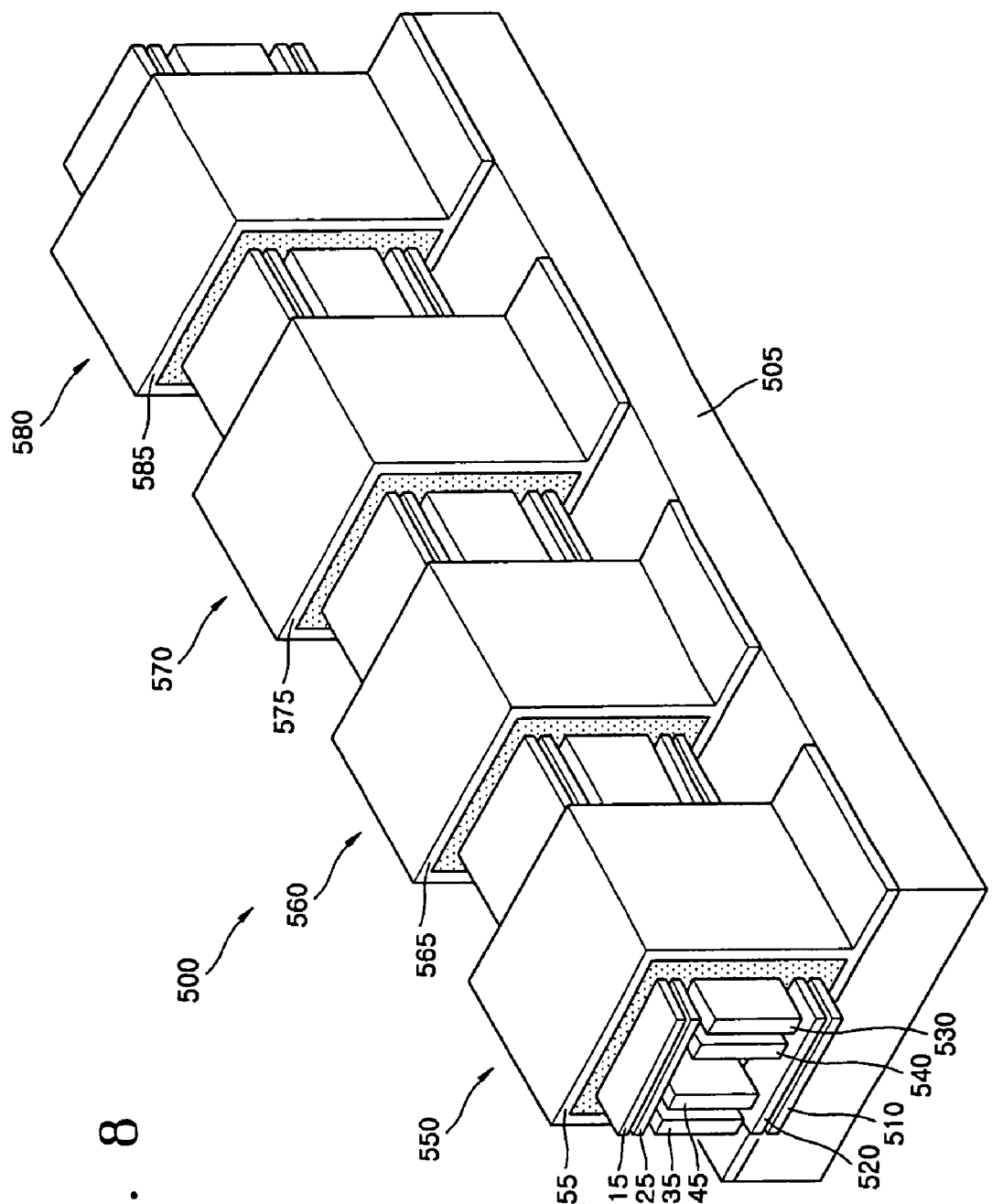
FIG. 8 is a perspective view of a nand cell array of a multi-bit flash memory device according to a fourth embodiment of the present disclosure.

FIG. 8 is a perspective view of a nand cell array 500 of a multi-bit flash memory device according to a fourth embodiment of the present disclosure.

Referring to FIG. 8, a nand cell array 500 of a multi-bit flash memory device may include unit cells 550, 560, 570 and 580 disposed along an axis. Each of the unit cells 550, 560, 570 and 580 may include a channel 520, and the channels 520 may be connected to one another; each of the unit cells 550, 560, 570 and 580 may include a channel 525, and the channels 525 may be connected to one another; each of the unit cells 550, 560, 570 and 580 may include a channel 540, and the channels 540 may be connected to one another; and each of the unit cells 550, 560, 570 and 580 may include a channel 545 and the channels are connected to one another.

Each of the unit cells 550, 560, 570 and 580 may have the same structure as the unit cell (300 shown in FIG. 5) according to the second embodiment. Therefore, the structures of unit cells 550, 560, 570 and 580 may be understood from the description made with FIGS. 5 and 6 and description thereof.

Referring to FIG. 8, storage nodes 510, 515, 530 and 535 may be common nodes of the unit cells 550, 560, 570 and 580. The storage nodes 510, 515, 530 and 535 may be composed of nitride or nano crystal silicon. Although the storage nodes 510, 515, 530 and 535 extend through the unit cells 550, 560, 570 and 580, charges stored in the storage nodes 510, 515, 530 and 535 may be confined to the respective unit cells 550, 560, 570 and 580.

In the nand cell array 500, control gates 555, 565, 575 and 585 may be used as word lines of the unit cells 550, 560, 570 and 580. In addition, each of the channels 520, 525, 540 and 545 may be used as common bit lines.

Accordingly, a sixteen-bit operation can be realized by selecting a word line and a bit line. In the present embodiment, the number of the unit cells set for exemplary purposes. The number of bits may be changed by changing the number of the unit cells.

The method of operating the unit cell may be identical to the method described in the first embodiment except that the method of the present embodiment may include selecting one of the control gates 555, 565, 575 and 585 of the nand cell array 500. Therefore, those skilled in the art may easily understand a method of operating the nand cell array 500.

Figure 9:
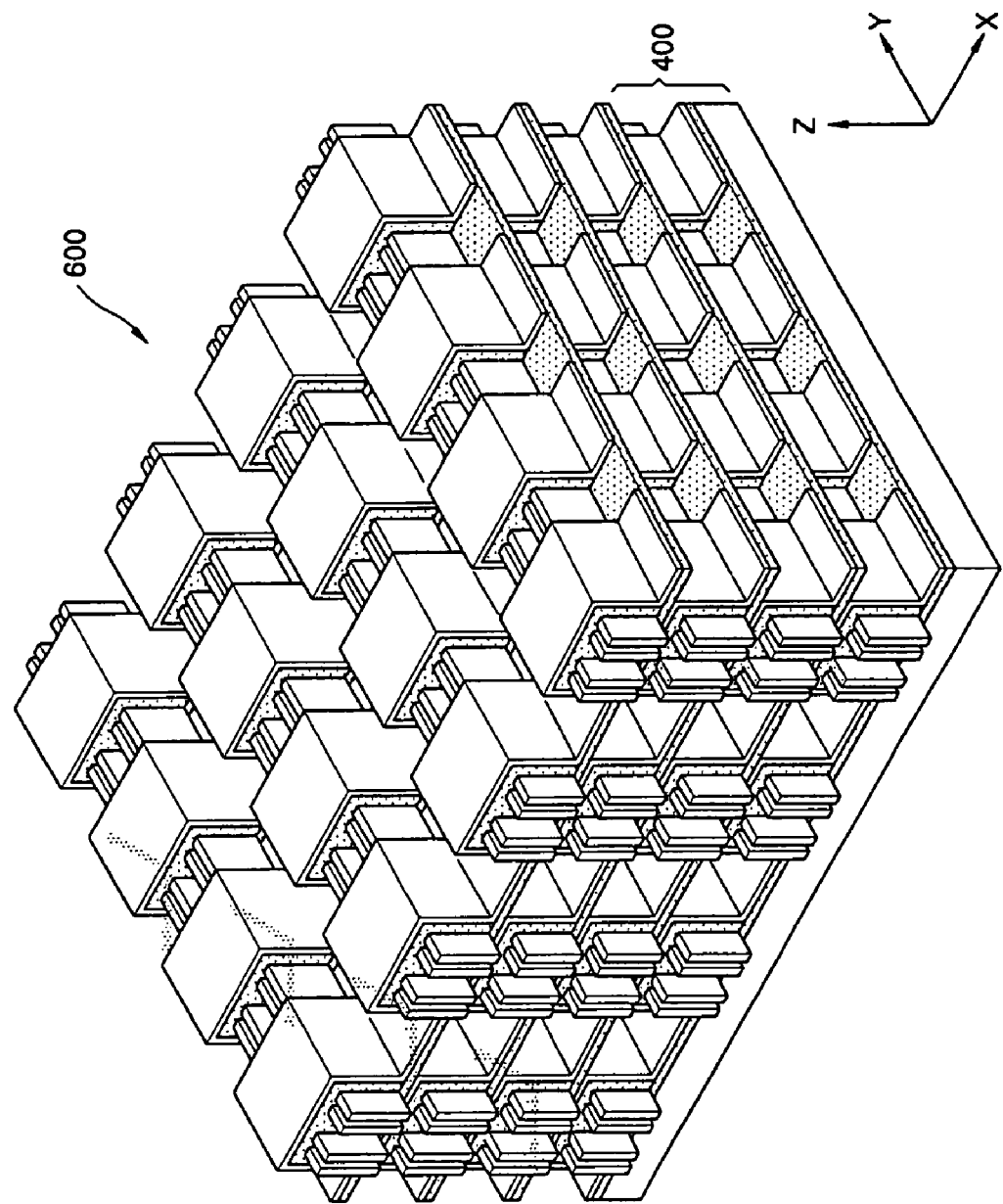
FIG. 9 is a perspective view of a nand cell array of a multi-bit flash memory device according to a fifth embodiment of the present disclosure.

FIG. 9 is a perspective view of a three-dimensional (3D) nand cell array 600 of a multi-bit flash memory device according to a fifth embodiment of the present disclosure.

Referring to FIG. 9, the 3D nand cell array 600 may include unit cells arranged along an x-axis, a y-axis, and a z-axis on a semiconductor substrate. Each of the unit cells may have the same structure as the unit cell according to the first embodiment, except that a single semiconductor substrate may be formed below all of the unit cells. In this structure, a unit cell array parallel to the y-axis may have the same structure as the nand cell array 400 described in the third embodiment.

The 3D nand cell array 600 may be formed by arranging nand cell arrays 400 according to the third embodiment along the x-axis and the z-axis. Therefore, the 3D nand cell array 600 may be understood from the description made with reference to FIG. 4 according to the third embodiment.

Channels of unit cells arranged parallel to the y-axis may be connected in the same manner as in the nand cell array 400 according to the third embodiment. Further, storage nodes of unit cells arranged parallel to the y-axis may be connected in the nand cell array 400 according to the third embodiment.

Channels of unit cells form in the yz plane may be connected by a metal line (not shown). Thus, the metal line may act as a common bit line of the unit cells formed in the yz plane.

In addition, control gates of unit cells arranged parallel to the x-axis may be connected to one another. Therefore, the unit cells parallel to the x-axis have a common word line. A method of operating the 3D nand cell array 600 may be understood with reference to the third embodiment.

Figure 10:
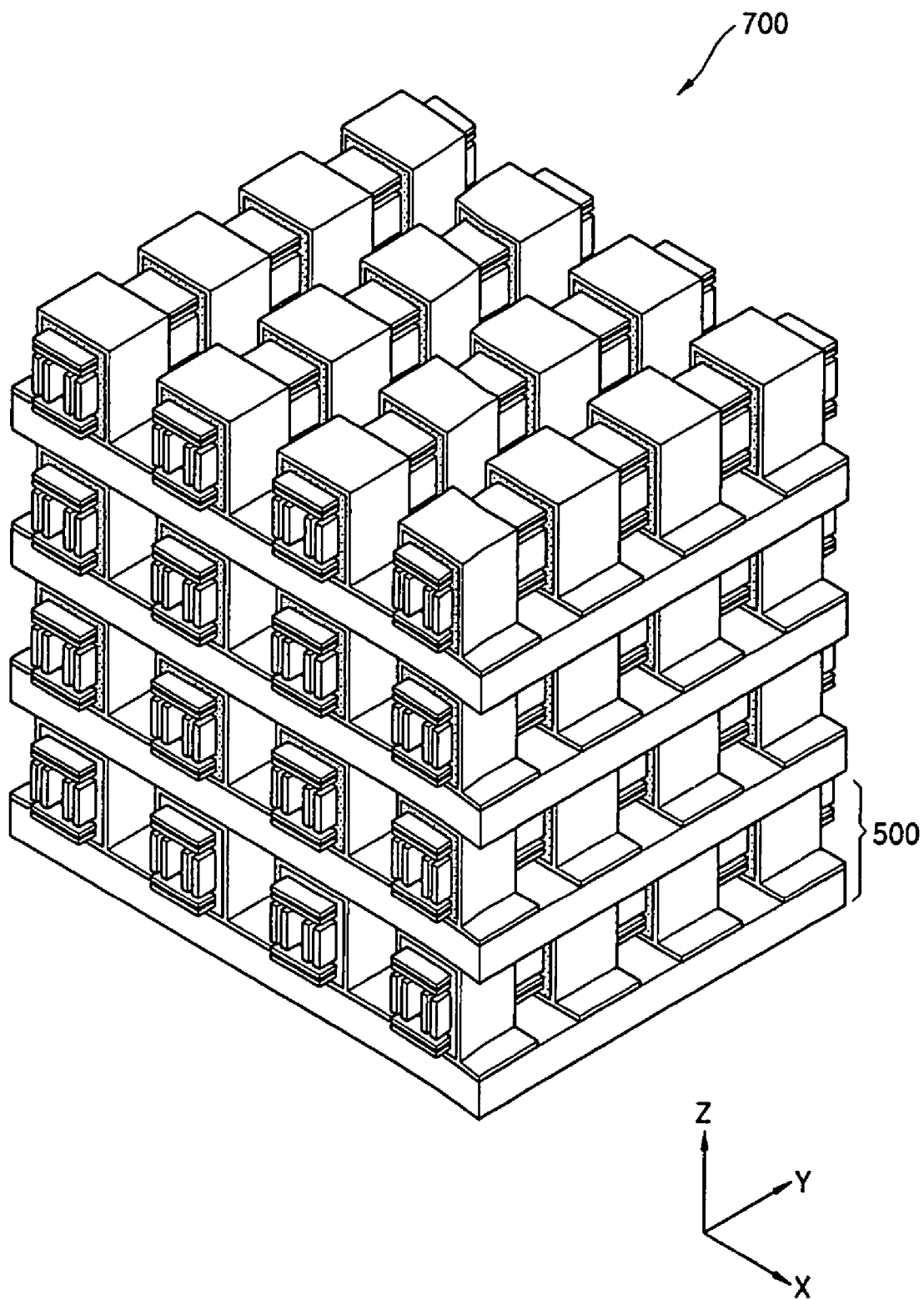
FIG. 10 is a perspective view of a nand cell array of a multi-bit flash memory device according to a sixth embodiment of the present disclosure.

FIG. 10 is a sectional view of a 3D nand cell array 700 of a multi-bit flash memory device according to a sixth embodiment of the present disclosure.

Referring to FIG. 10, the 3D nand cell array 700 may include unit cells arranged along an x-axis, a y-axis and a z-axis on a semiconductor substrate. The unit cells may have the same structure as the unit cells according to the second embodiment. That is, a unit cell array parallel to the y-axis may have the same structure as the nand cell array 500 according to the fourth embodiment.

The 3D nand cell array 700 may be formed by arranging nand cell arrays 500 according to the fourth embodiment along the x-axis and the z-axis. Therefore, the 3D nand cell array 700 may be understood with reference to the fourth embodiment.

Channels of unit cells arranged parallel to the y-axis may be connected in the same manner as in the nand cell array 500 according to the third embodiment. Further, storage nodes of unit cells arranged parallel to the y-axis may be connected in the nand cell array 500 according to the third embodiment.

Channels of unit cells form in the yz plane may be connected by a metal line (not shown). Thus, the metal line acts as a common bit line of the unit cells formed in the yz plane.

In addition, control gates of unit cells arranged parallel to the x-axis may be connected to one another. Therefore, the unit cells parallel to the x-axis may have a common word line. A method of operating the 3D nand cell array 700 can be understood with reference to the third embodiment.

FIGS. 11 through 18 are sectional views illustrating a method of manufacturing the multi-bit flash memory device shown in FIG. 3.

Figure 11:
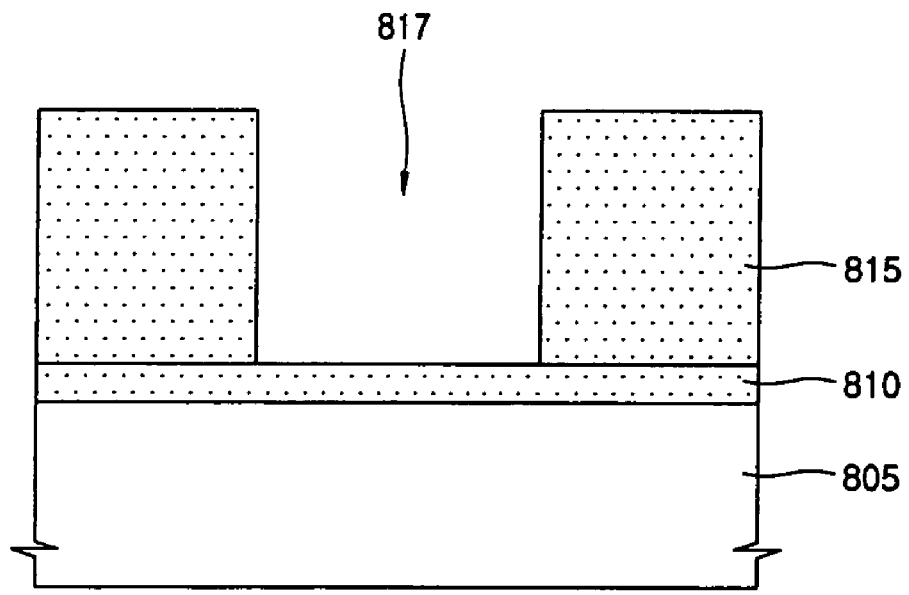
FIGS. 11 through 18 are sectional views illustrating a method of manufacturing the multi-bit flash memory device shown in FIG. 3.

Referring to FIG. 11, a first insulating film 810 and a second insulating film 815 may be formed on a semiconductor substrate 805. The first insulating film 810 and the second insulating film 815 may be composed of silicon oxide. Subsequently, a portion of the second insulating film 815 may be etched to form a trench 817.

Figure 12:
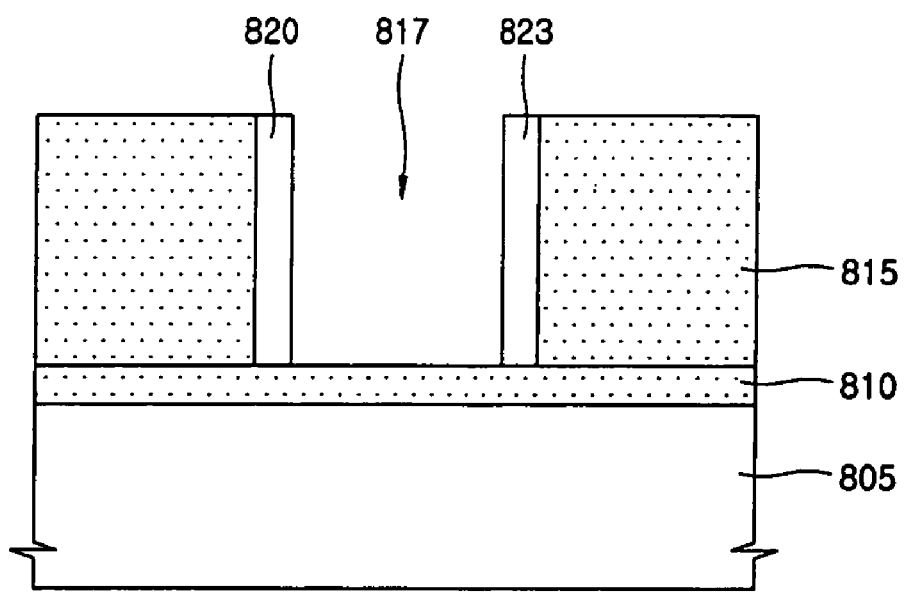

Referring to FIG. 12, a pair of storage nodes 820 and 823 may be formed on a side wall of the trench 817. The storage nodes 820 and 823 may be formed by depositing poly silicon, nano-crystal silicon, or nitride and then anisotropically etching the deposited layer.

Figure 13:
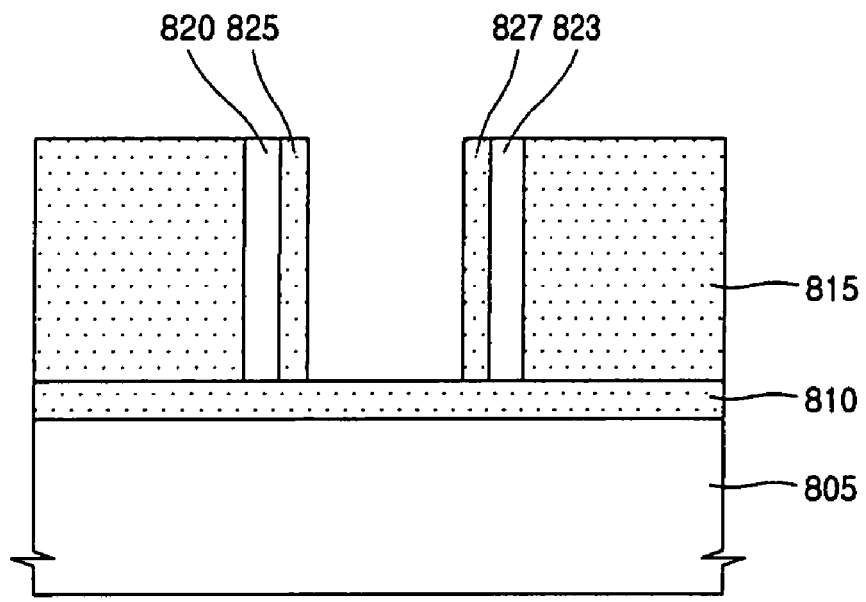

Referring to FIG. 13, a pair of tunneling oxide layers 825 and 827 may be formed on side walls of the storage nodes 820 and 823. The tunneling oxide layers 825 and 827 may be composed of silicon oxide.

Figure 14:
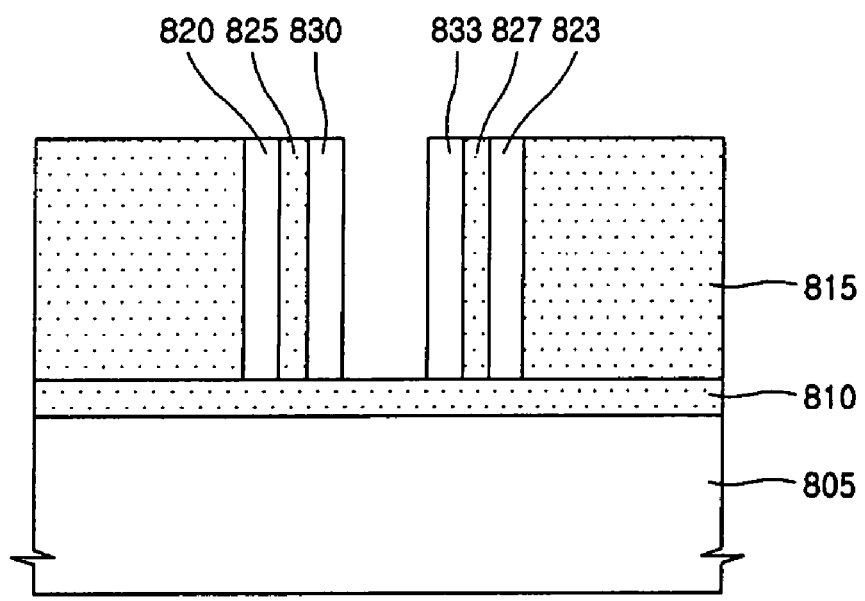

Referring to FIG. 14, a pair of channels 830 and 833 may be formed on a side wall of the tunneling oxide layers 825 and 827. The channels 830 and 833 may be formed by forming TMO and anisotropically etching the TMO. The TMO may be VOx.

Figure 15:
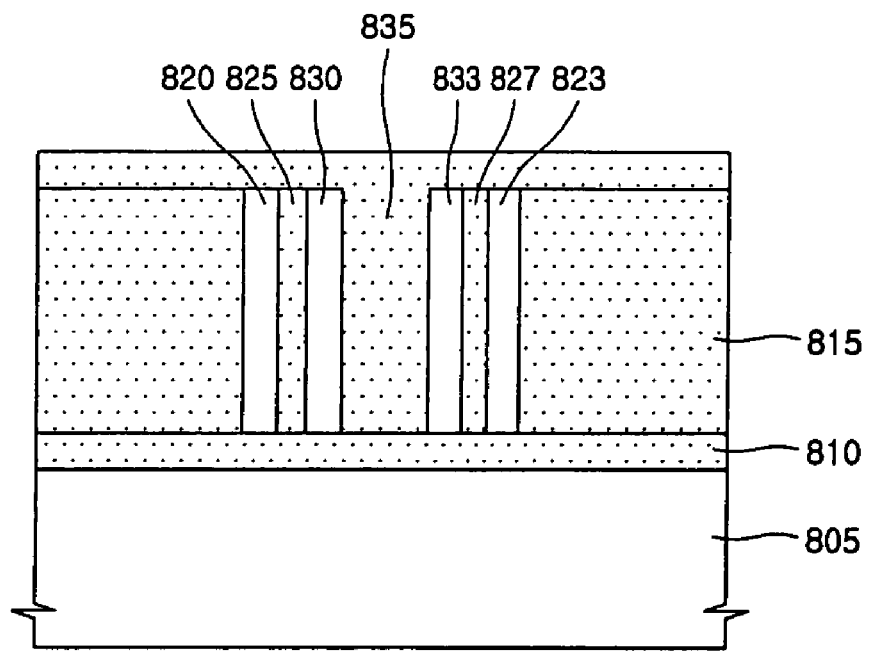

Referring to FIG. 15, a trench formed between the channels 830 and 833 may be filled by a third insulating film 835, and the third insulating film 835 is planarized. The third insulating film 835 may be silicon oxide. The third insulating film 835 may be planarized by etching back or chemical mechanical polishing (CMP).

Figure 16:
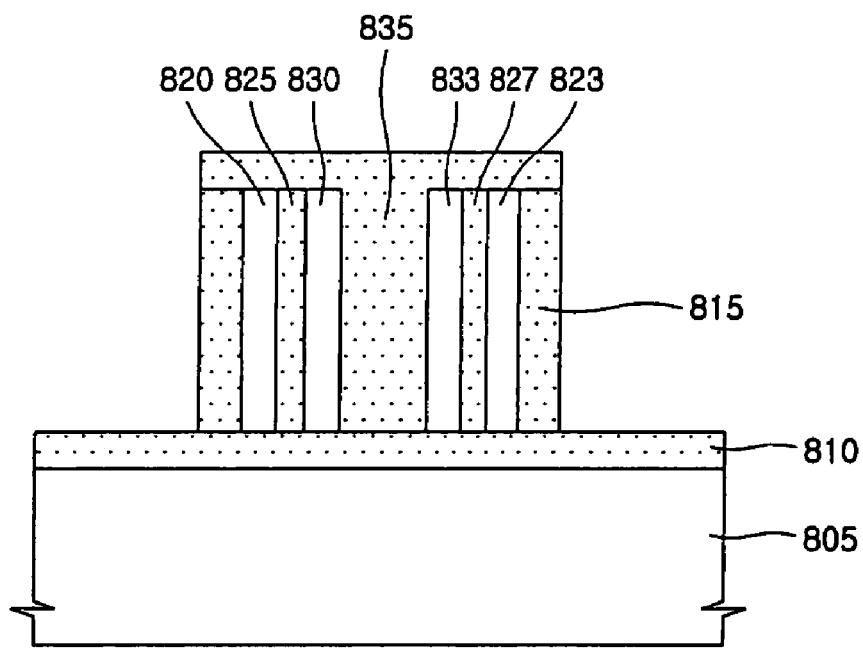

Referring to FIG. 16, the second and third insulating film 815 and 835 may be etched to form a pattern. The pattern may also be performed by photolithography.

Figure 17:
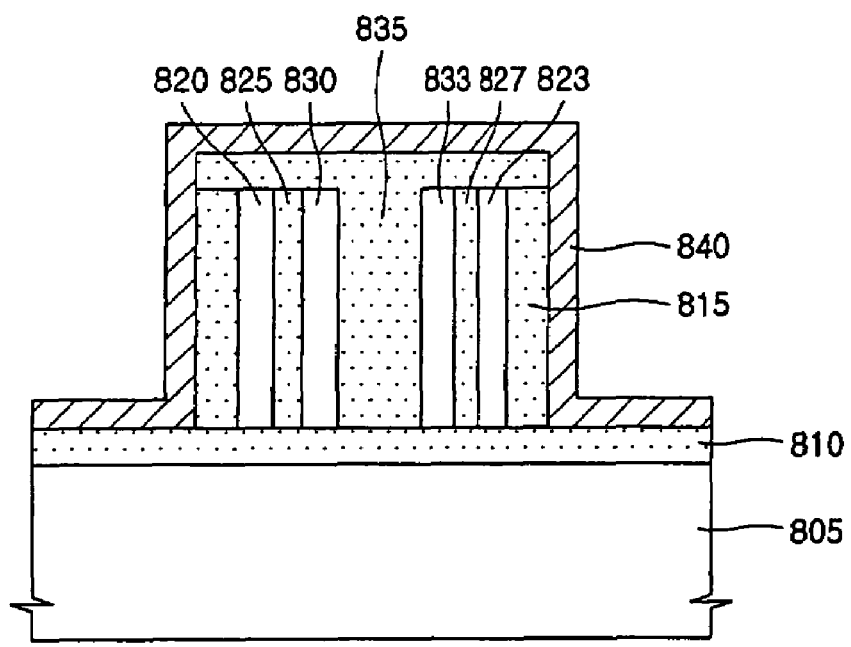

Referring to FIG. 17, a control gate 840 may be formed on the entire surface of the resultant structure. The control gate 840 may be composed of poly silicon, tungsten, tungsten silicide or a combination of thereof.

Figure 18:
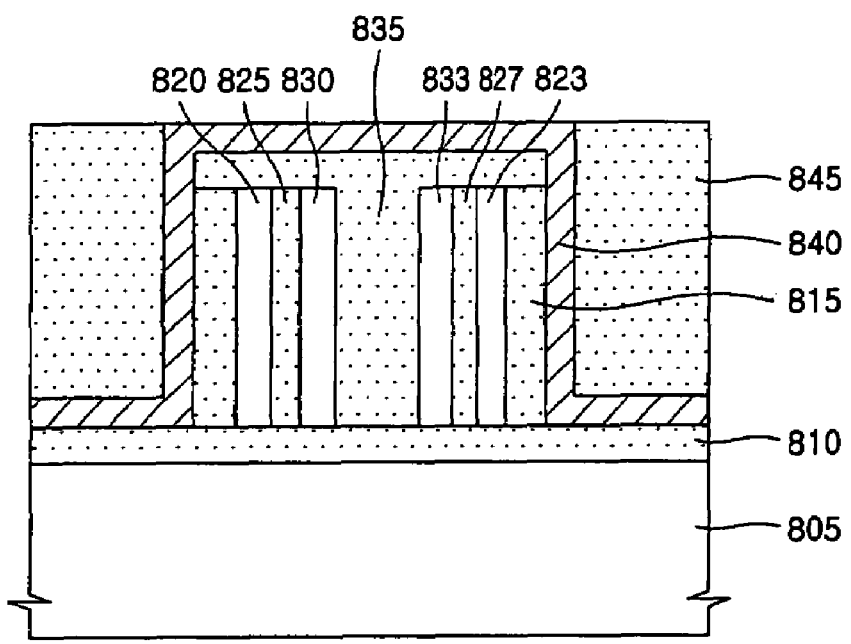

Referring to FIG. 18, a fourth insulating film 845 may be formed and planarized until the control gate 840 is exposed, thus forming the multi-bit flash memory unit cell according to the first embodiment.

When the above-mentioned method is performed in a plane, a nand cell array of the multi-bit flash memory device according to the third embodiment may be formed. In addition, by repeating the operation of forming a unit cell on the resultant structure formed above, those skilled in the art may easily manufacture the 3D nand cell array according to the fifth embodiment.

In addition, by adding an operation of forming upper and lower storage nodes and channels to the method of manufacturing the unit cell according to the first embodiment, those skilled in the art may easily manufacture the unit cell according to the second embodiment. Further, as with the method of forming the unit cell of the first embodiment, the method of forming the unit cell of the second embodiment may be used by those skilled in the art to manufacture the 3D nand cell arrays according to the fourth and sixth embodiments.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a multi-bit non-volatile memory device, the method comprising:

forming a first insulating film or insulating layer on a semiconductor substrate;

forming a second insulating film on the first insulating film;

forming a trench by etching a portion of the second insulating film;

forming a pair of storage nodes on side walls of the trench;

forming a pair of tunneling oxide layers on side walls of the storage nodes;

forming a pair of channels on side walls of the tunneling oxide layers;

forming a third insulating film filling a space between the channels and being planarized;

forming a pattern by etching the second and third insulating films outside the storage nodes; and forming a control gate on the entire surface of the resultant structure.

2. The method of claim 1, wherein the channels are formed by depositing a transition metal oxide that acts as an insulating material or a conducting material according to the removal or application of a voltage, respectively, and anisotropically etching the transition metal oxide.

3. The method of claim 2, wherein the transition metal oxide is vanadium oxide.

4. The method of claim 1, wherein the storage nodes are formed by depositing poly silicon, nano-crystal silicon, or nitride, and anisotropically etching the deposited poly silicon, nano-crystal silicon, or nitride.

5. The method of claim 1, wherein the insulating films comprise silicon oxide.

6. The method of claim 1, wherein the tunneling oxide layers comprise silicon oxide.

* * * * *